US010581225B1

(12) United States Patent
Su (10) Patent No.: US 10,581,225 B1
(45) Date of Patent: Mar. 3, 2020

(54) OPTICAL DEVICES WITH BANDWIDTH ENHANCING STRUCTURES

(71) Applicant: Avago Technologies International Sales Pte. Limited, Singapore (SG)

(72) Inventor: Chung-Yi Su, Fremont, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/143,692

(22) Filed: Sep. 27, 2018

(51) Int. Cl.
*H01S 5/183* (2006.01)
*H01S 5/42* (2006.01)
*H01S 5/187* (2006.01)

(52) U.S. Cl.
CPC .......... *H01S 5/18344* (2013.01); *H01S 5/187* (2013.01); *H01S 5/423* (2013.01); *H01S 2301/176* (2013.01)

(58) Field of Classification Search
CPC ...... H01S 5/18344; H01S 5/187; H01S 5/423; H01S 2301/176
See application file for complete search history.

(56) References Cited

U.S. PATENT DOCUMENTS

| 7,023,892 | B2 | 4/2006 | Wang et al. | |
|---|---|---|---|---|
| 7,817,696 | B2 | 10/2010 | Hatakeyama | |
| 8,188,487 | B2* | 5/2012 | Ikuta | H01S 5/18311 257/13 |
| 2003/0174750 | A1* | 9/2003 | Otsubo | B82Y 20/00 372/45.01 |
| 2007/0069225 | A1* | 3/2007 | Krames | H01L 21/2654 257/94 |
| 2017/0033535 | A1 | 2/2017 | Joseph | |

* cited by examiner

*Primary Examiner* — Xinning (Tom) Niu
(74) *Attorney, Agent, or Firm* — Sheridan Ross P.C.

(57) ABSTRACT

A light-emitting device includes a substrate having a first surface and an opposing second surface, and an epitaxial structure having a first surface and an opposing second surface. The second surface of the epitaxial structure is positioned in proximity with the first surface of the substrate. The light-emitting device includes a first metal layer having a first surface and an opposing second surface. The light-emitting device further includes at least one light confinement structure configured to confine light produced within the epitaxial structure. The at least one light confinement structure provides a low-refraction index boundary that confines the light in a mesa structure that is at least partially surrounded by the at least one light confinement structure. The at least one light confinement structure can also be arranged to create separate confinement regions to serve as bandwidth enhancement coupled cavities for the active region of the light-emitting device.

20 Claims, 8 Drawing Sheets

OPTICAL DEVICES WITH BANDWIDTH ENHANCING STRUCTURES

FIELD OF THE DISCLOSURE

Example embodiments are generally directed toward optical devices with light confining structures.

BACKGROUND

Vertical-Cavity Surface-Emitting Lasers (VCSELs) have been successfully deployed in high-speed data communication for several generations of data rates. However, VCSEL with conventional designs may have an inherent relaxation-oscillation-frequency limited bandwidth to prevent it from being used for greater than 50 GBaud applications.

BRIEF DESCRIPTION OF THE DRAWINGS

Inventive concepts are described in conjunction with the appended figures, which are not necessarily drawn to scale.

DETAILED DESCRIPTION

In general, VCSELs are comprised of an active region (or cavity region) sandwiched between two distributed Bragg reflector (DBR) structures that include multiple pairs of alternating low and high refractive index material to generate high reflectance at the desired emission wavelength. The high and low index materials will have different band gaps and the heterojunction presents a barrier for carrier transport. The cavity region contains the light-emitting gain material, for example, quantum wells separated by barriers and bounded on both sides by cladding layers that also act as barriers for carriers. As the industry develops, there is an increasing demand for VCSELs with enhanced bandwidth.

The ensuing description provides example embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of example embodiments will be described herein with reference to drawings that are schematic illustrations of idealized configurations. As such, variations from the shapes of the illustrations as a result, for example, manufacturing techniques and/or tolerances, are to be expected. Thus, the various aspects of example embodiments presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of example embodiments.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "includes," 'including," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Figure 1:
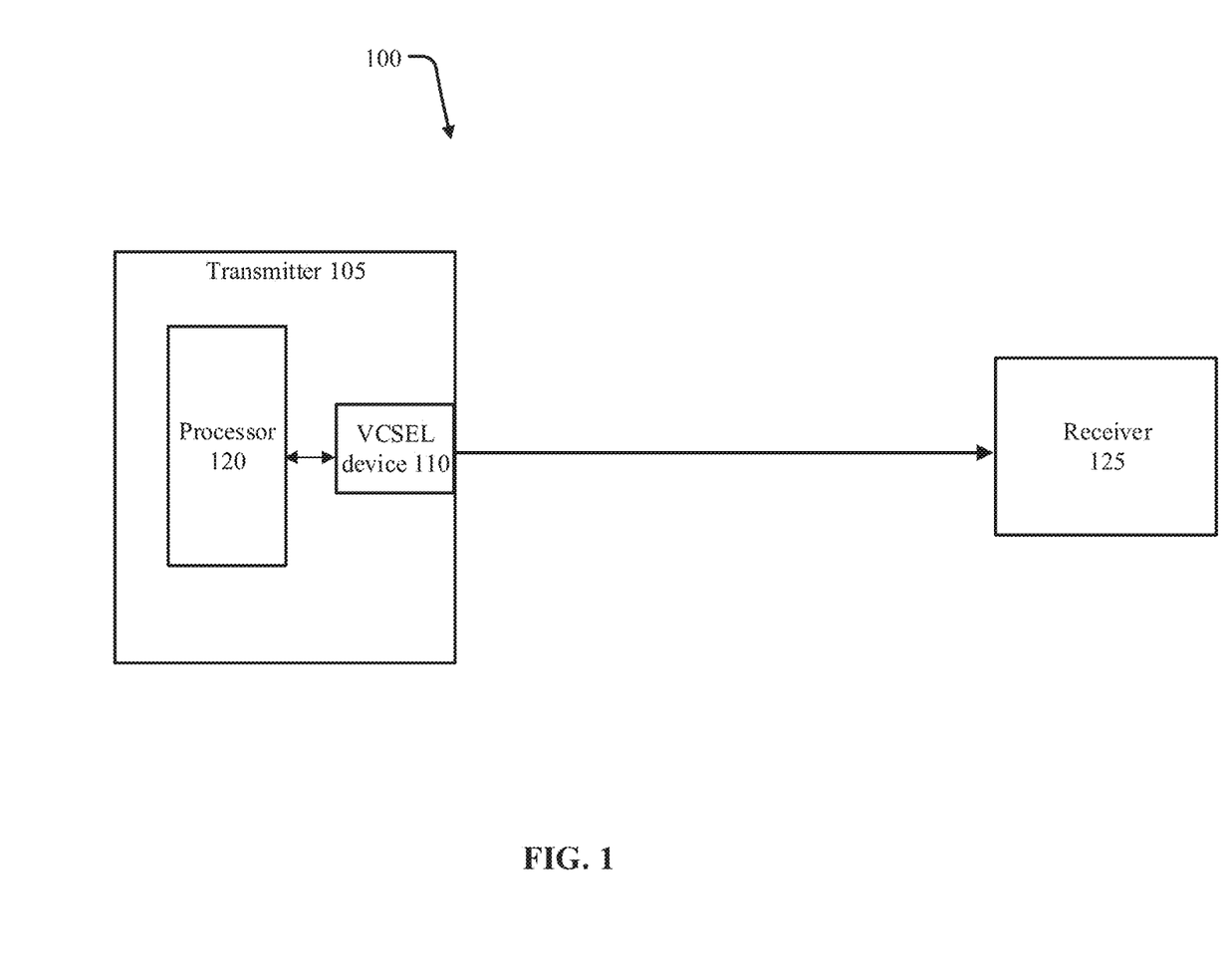
FIG. 1 illustrates an optical system in accordance with at least one example embodiment.

FIG. 1 illustrates an optical system 100 according to at least one example embodiment.

As shown in FIG. 1, the system 100 includes a transmitter 105 and a receiver 125. The transmitter 105 may include a VCSEL device 110 and at least one processor 120. In operation, the processor 120 controls the VCSEL device 110 to emit an optical signal toward the receiver 125. The emitted optical signal may be modulated with data by the processor 120 and transmitted to the receiver 125 via an optical cable or other suitable transmission means.

The VCSEL device 110 may include one or more VCSELs formed according to one or more of FIGS. 2A-6H. For example, the VCSEL device 110 may be an array of VCSELs formed, for example, in a matrix or other desired pattern. The VCSEL device 110 is described in more detail below with reference to FIGS. 2A-6H.

The receiver 125 may include circuitry for demodulating the received optical signal to recover the transmitted data. Such circuitry may include a sensor (e.g., a photodiode) for detecting the received optical signal from the VCSEL device 110 and at least one processor to demodulate the detected optical signal and recover the data.

The at least one processor 120 (and the processor of the receiver 125) may include any type of hardware and/or software for processing signals for the system 100. For example, the processor 120 may include a microprocessor with an associated memory including instructions that are executable by the microprocessor. For example, the memory may be random access memory (RAM), read-only memory (ROM), dynamic RAM (DRAM), solid-state disk (SSD), and/or other storage device(s) and media. The memory may be volatile and/or non-volatile in nature. Additionally or alternatively, the processor 120 may include a field programmable gate array (FPGA), an application specific integrated circuit (ASIC) or other circuitry for processing signals of the system 100. The processor 120 as described herein may perform computational functions using any known or future-developed standard, instruction set, libraries, and/or architecture.

Figure 2A:
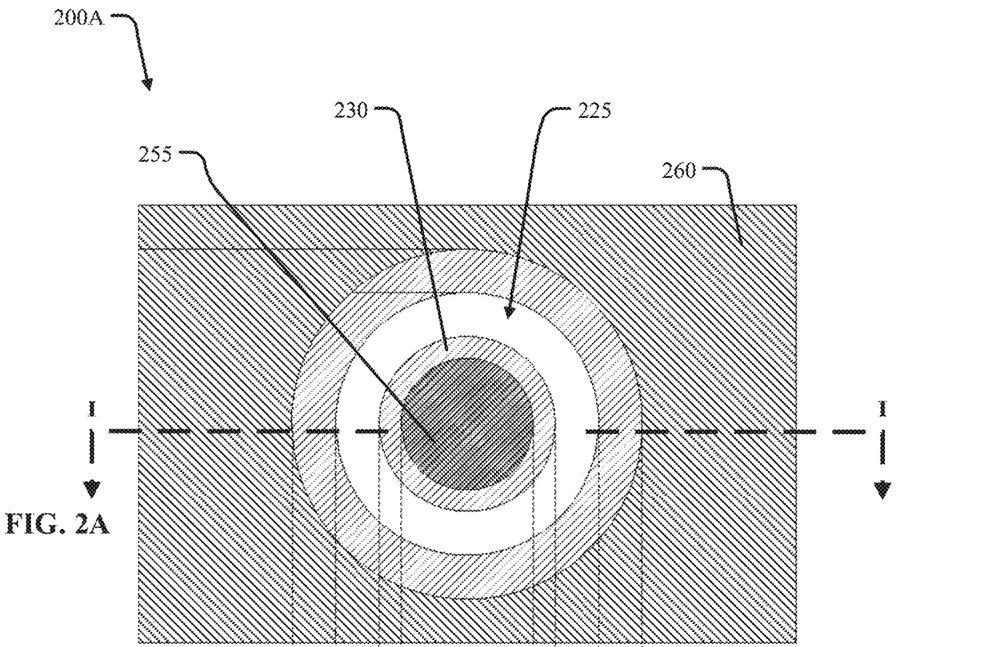
FIG. 2A is a planar view of an optical device (or light-emitting device) in accordance with at least one example embodiment of a p-down, n-side emitting VCSEL.
Figure 2B:
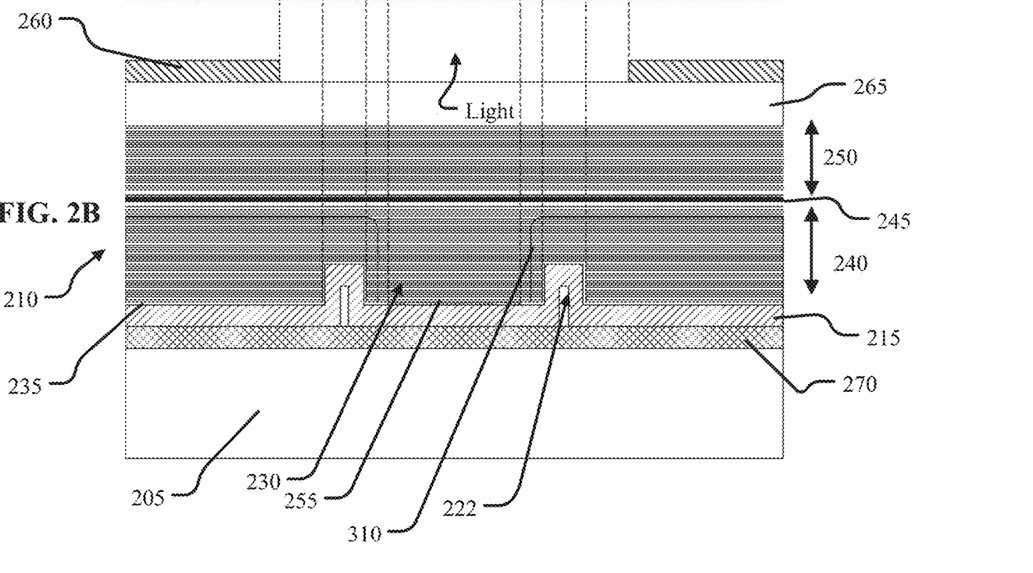
FIG. 2B illustrates a cross-sectional view of the optical device along line I-I in FIG. 2A.

FIG. 2A is a planar view of an optical device (or light-emitting device) 200A in accordance with at least one example embodiment of a p-down, n-side emitting VCSEL. FIG. 2B illustrates a cross-sectional view of the optical device 200A along line I-I in FIG. 2A.

As shown in FIGS. 2A and 2B, the optical device 200A may include a substrate 205 having a first surface and an opposing second surface. The substrate 205 may be a high thermal-conductivity non-native substrate that can be electrically conductive or insulative.

The optical device 200A may further includes an epitaxial structure 210 having a first surface and an opposing second surface. The second surface of the epitaxial structure 210 may be positioned in proximity with the first surface of the substrate 205. The optical device 200A may further include a first metal layer 215 having a first surface and an opposing second surface. Here, the second surface of the first metal layer 215 faces toward the first surface of the substrate 205. Note that the metal layer 215 is not shown in FIG. 2A for clarity. The optical device 200A may further includes at least one light confinement structure 225 configured to confine light produced within the epitaxial structure 210 to a specific region of a desired size. According to at least one example embodiment, the at least one light confinement structure 225 provides a low-refraction index boundary (see 227 in FIG. 3A, for example) that confines the light in an active region 230 that is at least partially surrounded by the at least one light confinement structure 225. According to at least one example embodiment, the at least one light confinement structure 225 comprises a trench 222 in the epitaxial structure 210 that at least partially surrounds the active region 230 to form a mesa structure. For example, in FIGS. 2A and 2B, the trench 222 completely surrounds the mesa structure 225. The trench 222 may be formed in the epitaxial structure 210 using a lithography process in conjunction with another suitable etching method. Region 310, which substantially lies outside the active region 230 but may overlap with it by some amount, is implanted with high-energy ions such as H+ or He+ to render region 310 electrically inactive and thereby to limit the bias current to be well within the optically confined active region 230. Note that this implanted region 310 delineated in FIG. 2B is omitted in the top view FIG. 2A for clarity. As shown in FIG. 2B, the metal layer 215 may be at least partially formed in the trench 222.

According to at least one example embodiment, the optical device 200A includes a passivation layer 235 positioned between the substrate 205 and the epitaxial structure 210. For example, the passivation layer 235 is sandwiched between the metal layer 215 and the epitaxial structure 210 outside the first contact 255. As shown in FIG. 2B, the passivation layer 235 may be included in the at least one light confinement structure 225 (i.e., in the trench 222). The passivation layer 235 may include SiN or other suitable passivation material.

As shown in FIG. 2B, the epitaxial structure 210 may include a first distributed Bragg reflector (DBR) stack 240 and a quantum well (QW) region 245. The epitaxial structure 210 may further include a second DBR stack 250. The QW region 245 is sandwiched between the first DBR stack 240 and the second DBR stack 250, and may include at least one quantum well structure with a light-emitting material that emits light in the presence of an applied electrical current. For example, the quantum well structure QW 245 may include a layer of a semiconductor material (e.g., GaAs) sandwiched between two layers of material having a wider band gap (e.g., AlGaAs) than the semiconductor material. According to at least one example embodiment, the first DBR stack 240 comprises one or more layers with p-type doping, and the second DBR stack 250 comprises one or more layers with n-type doping. As shown, the first DBR stack 240 is closer to the substrate than the second DBR stack 250.

The optical device 200A may further include a first contact 255 and a second contact 260. According to at least one example embodiment, the first contact 255 contacts p-type material and the second contact 260 contacts an n-type material. As shown, the passivation layer 235 may surround the first contact 255. The first and second contacts 255 and 260 may include metal or other suitable conductive material. The first contact 255 may have light-blocking properties and/or reflective properties to reflect light away from the first contact 255 in a direction toward the QW region 245.

The optical device 200A may further include a buffer region 265. The buffer region 265 may include an n-type material. Here, it should be understood that the buffer region 265 is part of the first layer of the epitaxial structure 210 epitaxially grown on a native substrate, such as GaAs, that is removed by a grinding, polishing and etching process. The surface of this buffer layer 265 resulted from the substrate removal is optically smooth. The optical device 200A also includes a second metal layer 270. The second metal layer 270 may be formed on the substrate 205 and then bonded to the first metal layer 215.

Figures 3A, 3B, 3C:
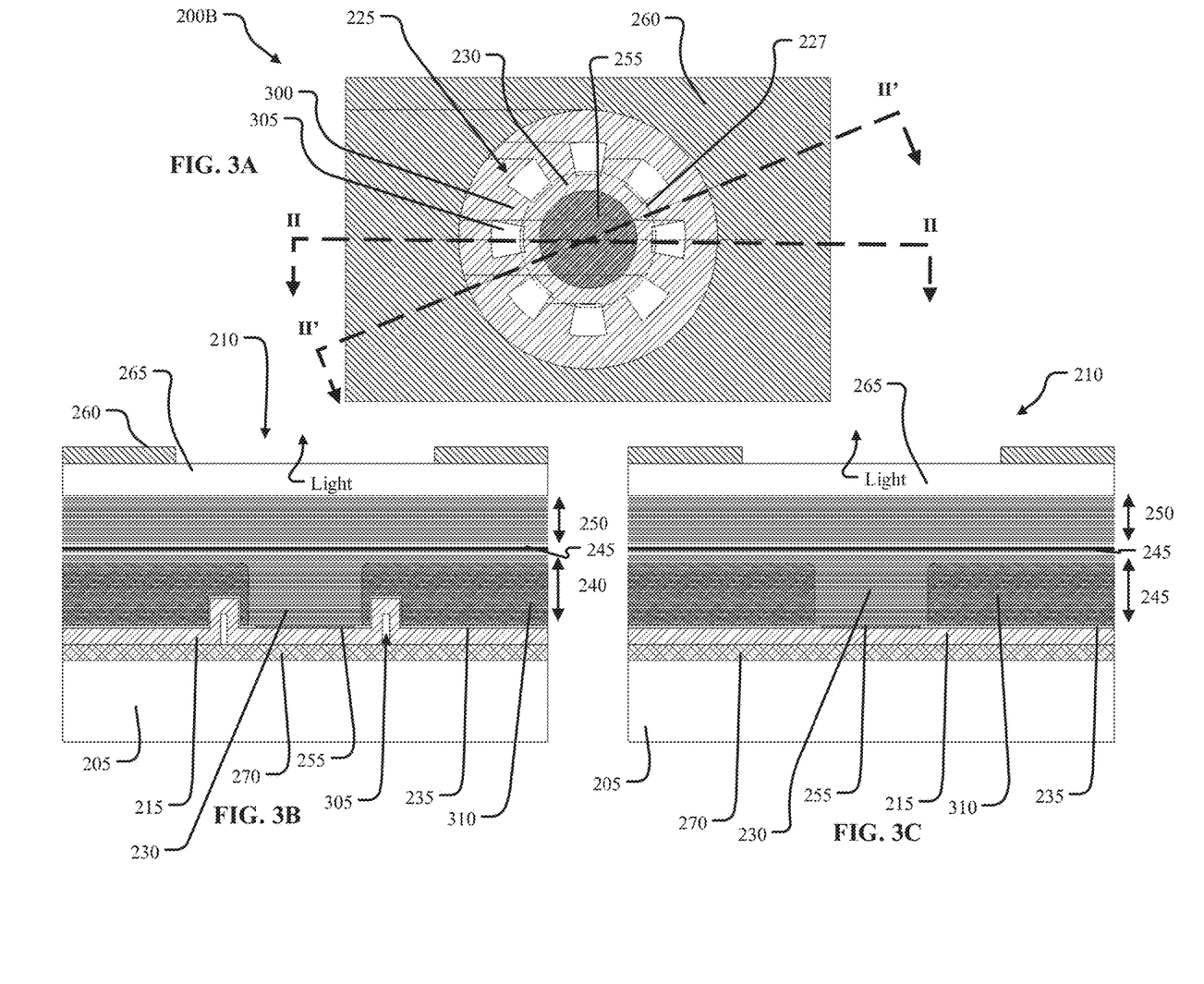
FIG. 3A is a planar view of an optical device (or light-emitting device) in accordance with at least one example embodiment of a p-down, n-side emitting VCSEL without the use of oxide confinement and with structures to optimize index-guiding strength and scattering loss.
FIG. 3B illustrates a cross-sectional view of the optical device along line II-II in FIG. 3A.
FIG. 3C illustrates a cross-sectional view of the optical device along line II'-II' in FIG. 3A.

FIG. 3A is a planar view of an optical device (or light-emitting device) 200B in accordance with at least one example embodiment of a p-down, n-side emitting VCSEL without the use of oxide confinement and with structures to optimize index-guiding strength and scattering loss. FIG. 3B illustrates a cross-sectional view of the optical device 200B along line II-II in FIG. 3A. FIG. 3C illustrates a cross-sectional view of the optical device 200B along line II'-II' in FIG. 3A.

The reference numerals shown in FIGS. 3A-3C refer to the same numbered elements from FIGS. 2A and 2B. Accordingly, a description thereof will not be repeated here. FIGS. 3A-3C illustrate another example of the at least one light confinement structure 225. Here, the at least one light confinement structure 225 surrounding the active region 230 comprises one or more un-etched areas 300 of the epitaxial structure 210 that are interspersed between one or more etched areas 305 of the epitaxial structure 210. As shown, the unetched areas 300 bound the etched areas 305 to create separate light confinement regions within the at least one light confinement structure 225. As shown in FIG. 3A, the separate light-confinement regions comprise one or more pocket structures (i.e., the etched areas 305) arranged (e.g., symmetrically arranged) around a center of the active region 230. Eight pocket structures are illustrated, but fewer or more pocket structures may be included according to design preferences.

According to at least one example embodiment, proportions of the one or more un-etched areas 300 and proportions of the etched areas 305 are selected to balance a desired index-guiding strength with scattering losses experienced by the active region 230.

It should be appreciated that FIGS. 3A-3C illustrate an example light confinement structure that includes partial etching of the perimeter surrounding the active region 230, which offers flexibility in terms of the index-guide design without excessive or undesired scattering loss.

Figures 4A, 4B, 4C:
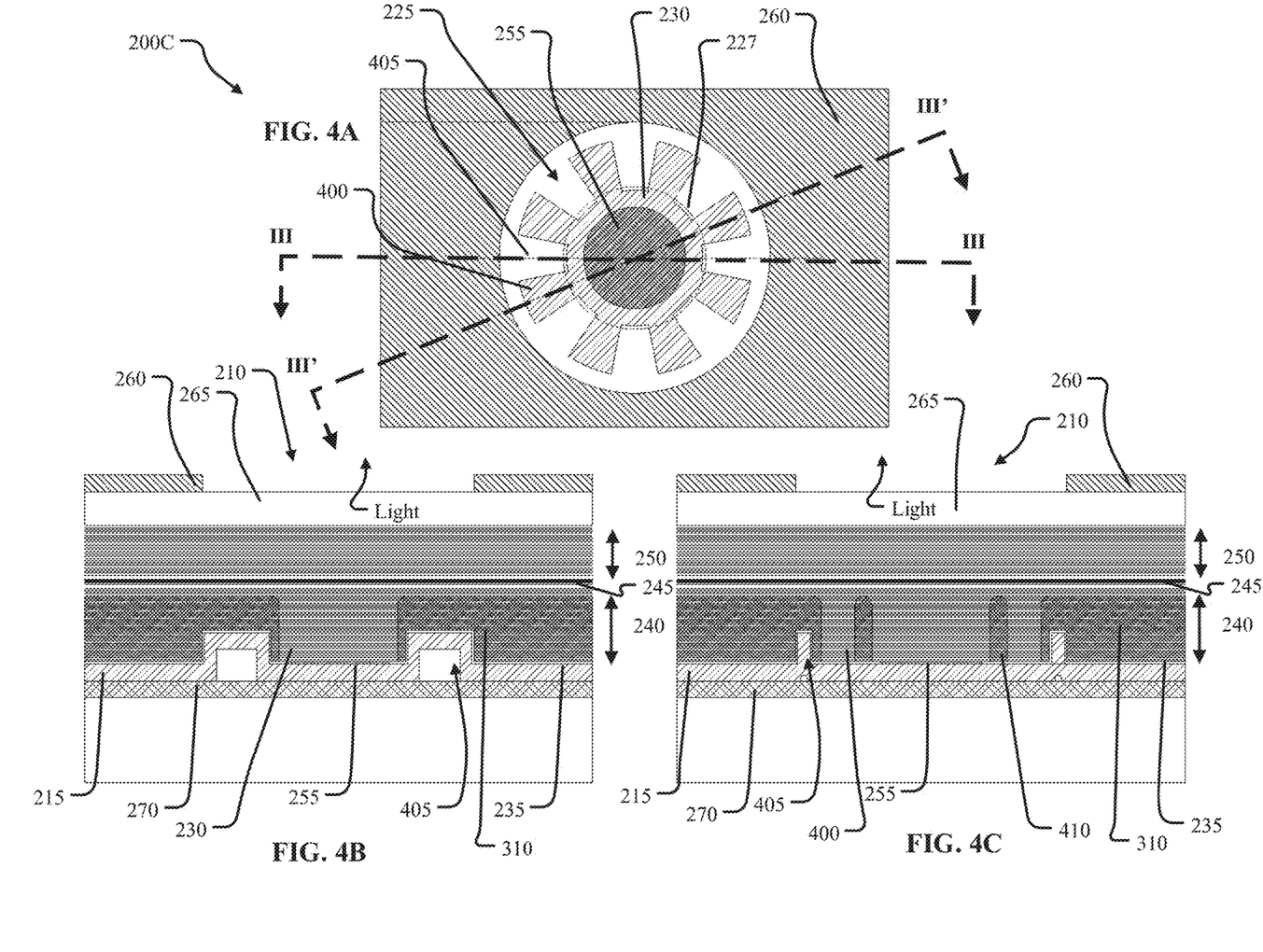
FIG. 4A is a planar view of an optical device (or light-emitting device) in accordance with at least one example embodiment of the modification of the embodiment shown in FIG. 3A to include feedback cavities.
FIG. 4B illustrates a cross-sectional view of the optical device along line in FIG. 4A.
FIG. 4C illustrates a cross-sectional view of the optical device along line III'-III' in FIG. 4A.

FIG. 4A is a planar view of an optical device (or light-emitting device) 200C in accordance with at least one example embodiment of the modification of the embodiment shown in FIG. 3A to include feedback cavities. FIG. 4B illustrates a cross-sectional view of the optical device 200C along line in FIG. 4A. FIG. 4C illustrates a cross-sectional view of the optical device 200C along line III'-III' in FIG. 4A. The optical device 200C may correspond to a VCSEL in the VCSEL device 110 of FIG. 1.

The reference numerals shown in FIGS. 4A-4C refer to the same numbered elements from FIGS. 2A and 2B. Accordingly, a description thereof will not be repeated here. FIGS. 4A-4C illustrate another example of the at least one light confinement structure 225. Here, the at least one light confinement structure 225 comprises one or more un-etched areas 400 of the epitaxial structure 210 and one or more etched areas 405 of the epitaxial structure 210. As shown, the etched areas 405 bound the un-etched areas 400 to create separate light-confinement regions of the at least one light confinement structure 225. The separate light-confinement regions comprise one or more spoke-shaped structures (i.e., the unetched areas 400) that extend from a center of the active region 230. Eight spoke-shaped structures extending from the active region 230 are illustrated, but fewer or more structures may be included according to design preferences. As shown, the spoke-shaped structures may be symmetrically arranged (however, other arrangements are possible if desired). According to at least one example embodiment, proportions of the one or more un-etched areas 400 and proportions of the etched areas 405 are selected to balance a desired index-guiding provided by the at least one active region 230 with scattering losses induced by the active region 230.

As shown in FIG. 4C, each spoke structure may include an ion implantation region 410 to electrically isolate each spoke structure from the main active region 230. The ion implantation region 410 may include a doped semiconductor material (e.g., doped with a p-type dopant) that is conductive and ion implantation removes this conductivity.

In view of the above, it should be appreciated that the spokes illustrated in FIGS. 4A-4C provide coupled cavities (i.e., coupled spokes) to form a bandwidth enhancing dispersive optical load to the main part of the active region 230.

Figure 5A:
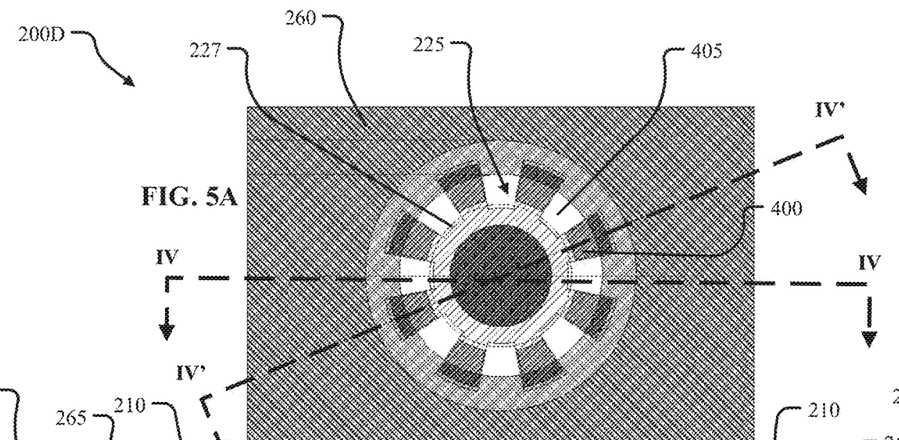
FIG. 5A is a planar view of an optical device (or light-emitting device) in accordance with at least one example embodiment in which independent biases can be provided to the main and the feedback cavities.
Figure 5B:
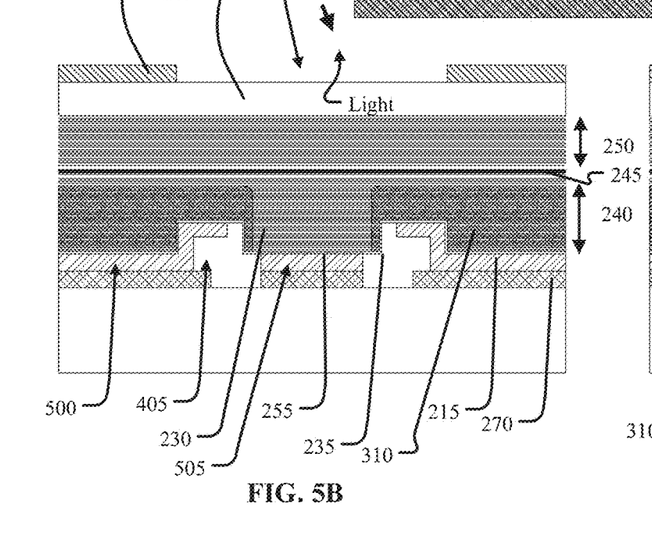
FIG. 5B illustrates a cross-sectional view of the optical device along line IV-IV in FIG. 5A.
Figure 5C:
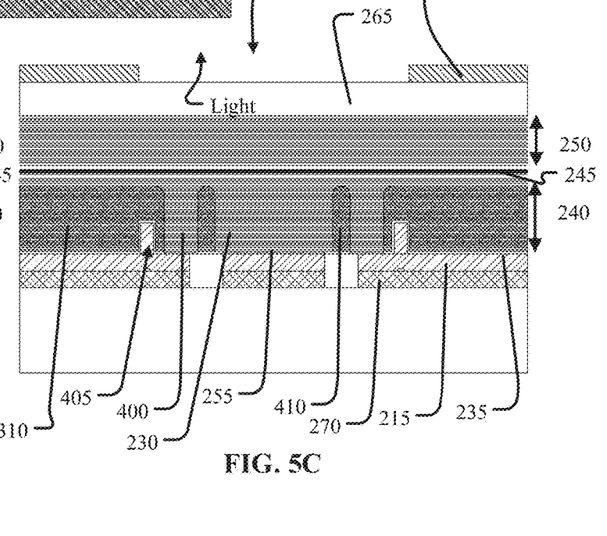
FIG. 5C illustrates a cross-sectional view of the optical device along line IV'-IV' in FIG. 5A.

FIG. 5A is a planar view of an optical device (or light-emitting device) 200D in accordance with at least one example embodiment in which independent biases can be provided to the main and the feedback cavities. FIG. 5B illustrates a cross-sectional view of the optical device 200D along line IV-IV in FIG. 5A. FIG. 5C illustrates a cross-sectional view of the optical device 200D along line IV'-IV' in FIG. 5A. The optical device 200D may correspond to a VCSEL in the VCSEL device 110 of FIG. 1.

The reference numerals shown in FIGS. 5A-5C refer to the same numbered elements from FIGS. 2A and 2B. Accordingly, a description thereof will not be repeated here. FIGS. 5A-5C illustrate another example of the at least one light confinement structure 225. FIGS. 5A-5C show a same or similar spoke-shaped structure of the light confinement structure 225 as in FIGS. 4A-4C, except that FIGS. 5A-5C allow each spoke structure to receive an independent direct current (DC) bias signal. In this case, each spoke structure utilizes a portion 500 of the first metal layer 215 as a bias contact. The active region 230 utilizes a portion 505 of the first metal layer as a bias contact. As shown in FIGS. 5B and 5C, the portion 500 is electrically isolated from the portion 505 by having a gap in metal layer 215. This structure combined with the formation of ion-implantation region 410 allows for the independent application of bias signals to the active region 230 through the first contact 255 and to the spokes that form coupled-cavities to the active region 230. Applying a bias signal to the spoke-structure(s) may change the coupling strength and bandwidth enhancement of the optical device 200D. The portions 500 and/or 505 may comprise a contact metal to p-type or other suitable conductive material and are also capable of being bonded to the second metal layer 270.

FIGS. 6A-6F illustrate planar views of optical devices according to example embodiments. The reference numerals shown in FIGS. 6A-6F refer to the same numbered elements from FIGS. 2A and 2B. Accordingly, a description thereof will not be repeated here. Here, it should be understood that although only planar views are illustrated in FIGS. 6A-6F, each optical device will have substantially the same or similar elements illustrated in the views from FIGS. 2A-5C.

Figure 6A:
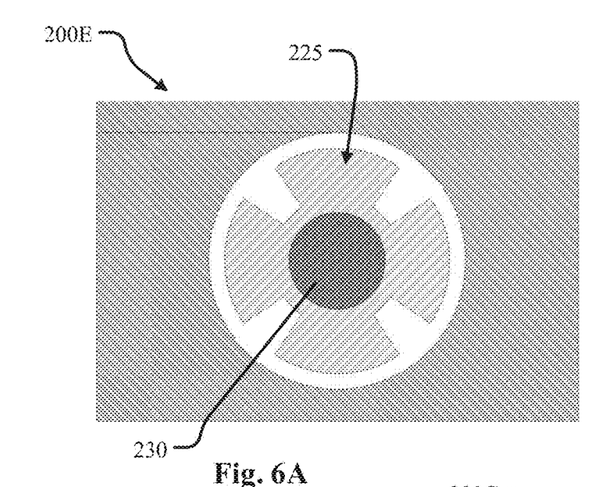
FIGS. 6A-6H illustrate planar views of optical devices according to at least one example embodiment.
Figure 6B:
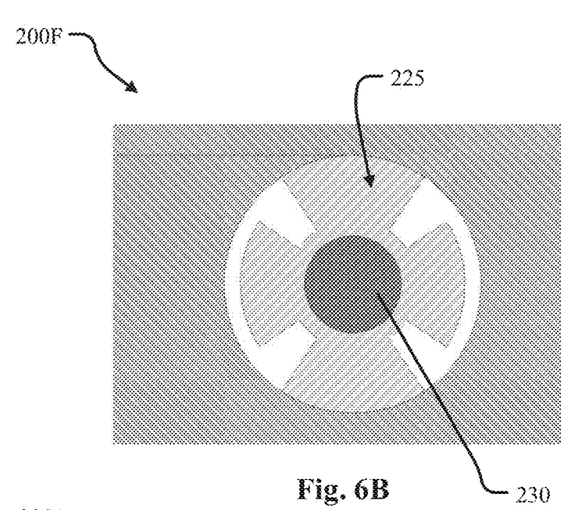
Figure 6C:
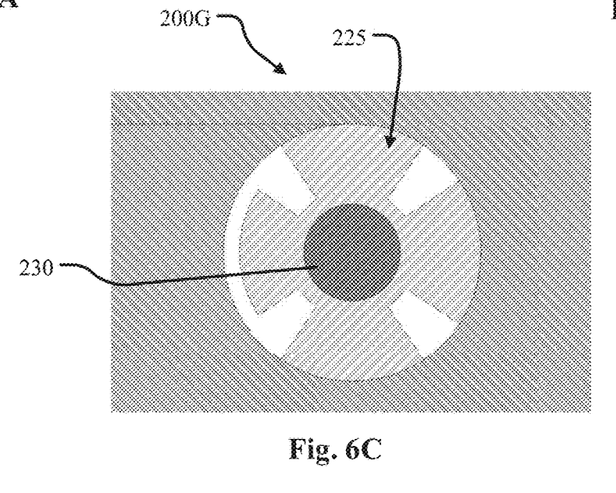

FIG. 6A illustrates an optical device 200E, where the light confinement structure 225 includes an etched region that defines four spoke-shaped structures (or four sections of coupled cavities). FIG. 6B illustrates an optical device 200F, where the light confinement structure 225 includes etched regions that provide the same strength of index-guiding for the active region as that illustrated in FIG. 6A but define only two sections of coupled cavity. FIG. 6C illustrates an optical device 200G, where the light confinement structure 225 includes etched regions that provide the same strength of index-guiding for the active region as that illustrated in FIGS. 6A and 6B but define just one section of coupled cavity. In FIGS. 6A-6C, about 25% of the perimeter of the active region 230 is adjacent to an etched region(s).

Figure 6D:
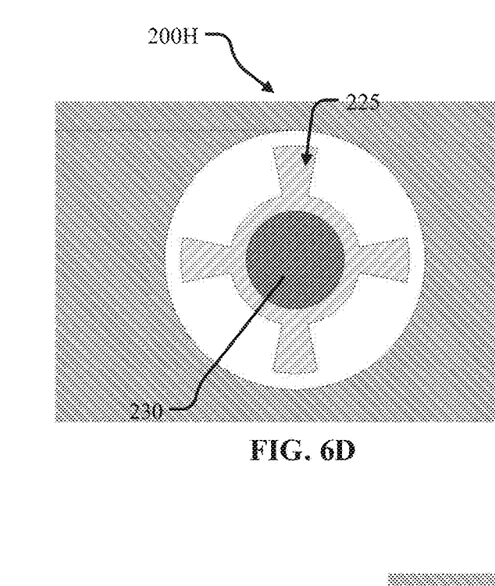
Figure 6E:
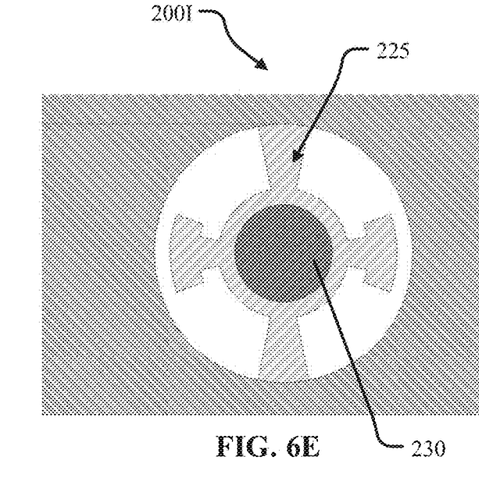
Figure 6F:
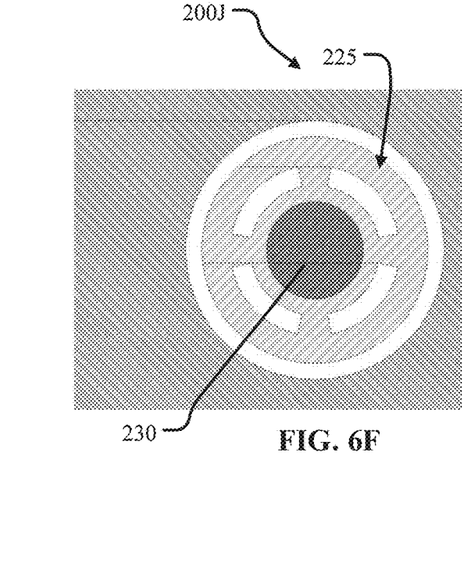

FIG. 6D illustrates an optical device 200H, where the light confinement structure 225 includes an etched region that defines four spoke-shaped structures (or four sections of coupled cavities). FIG. 6E illustrates an optical device 200I, where the light confinement structure 225 includes etched regions that provide the same strength of index-guiding for the active region as that illustrated in FIG. 6D but define only two sections of coupled cavity. FIG. 6F illustrates an optical device 200J, where the light confinement structure 225 includes etched regions that define a donut shaped coupled cavity connected to the main cavity (e.g., the active region 230 defined by the mesa structure) at four locations. In FIGS. 6D-6F, about 75% of the perimeter of the mesa structure 230 is adjacent to an etched region(s).

Figure 6G:
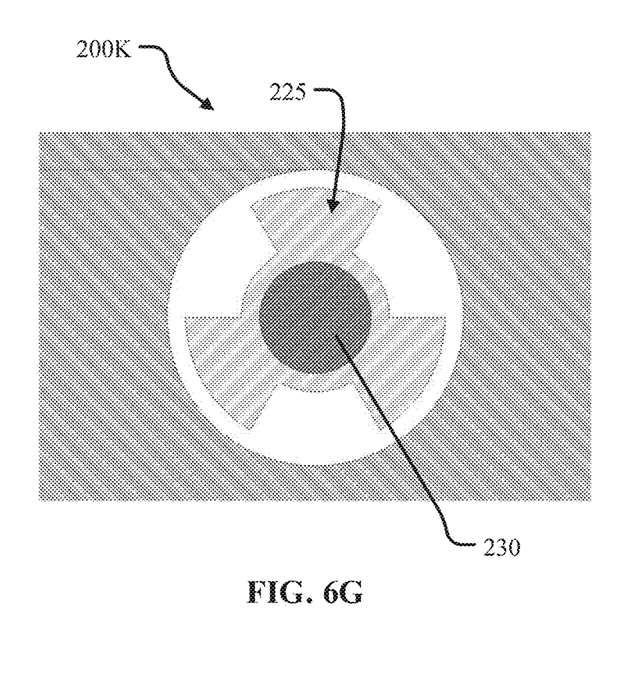
Figure 6H:
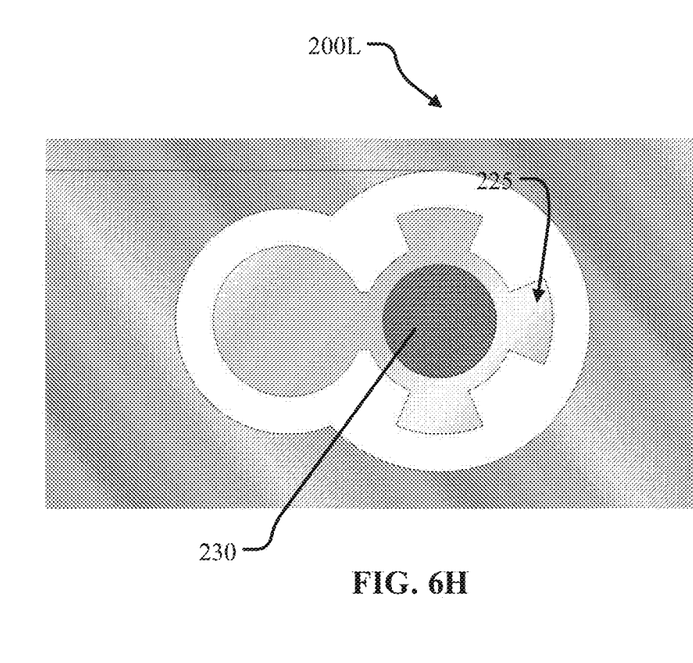

FIG. 6G illustrates an optical device 200K, where the light confinement structure 225 includes an etched region that defines three spoke-shaped structures (or three sections of coupled cavities). FIG. 6H illustrates an optical device 200L, where the light confinement structure 225 includes etched regions that define a dumbbell shaped coupled cavity. In FIGS. 6G and 6H, about 50% of the perimeter of the active region 230 is adjacent to an etched region(s).

In view of the foregoing description, it should be appreciated that at least one example embodiment may include a semiconductor device. The semiconductor device may include a non-native substrate 205 and VCSEL die having a front side and a back side that faces toward the non-native substrate 205. Laser light produced by the VCSEL die is emitted through the side that is opposite to the side of the non-native substrate. The VCSEL die comprises an epitaxial structure 210 and a first metal layer 215 sandwiched between the non-native substrate 205 and the epitaxial layer 210. The VCSEL die further includes a light confinement structure 225 configured to confine light produced within the epitaxial structure 210, which in combination with a contact 255, cause the confined light to emit to a specific region of a desired size. The light confinement structure 225 provides a low-refraction index boundary 227 that confines light in an active region 230 that is at least partially surrounded by the light confinement structure 225.

According to at least one example embodiment, wherein the light confinement structure 225 comprises a trench that at least partially surrounds the active region 230. Ion-implantation in region 310 at the periphery of and outside the light-confinement region removes the electrical conductivity outside the active region 230 to further assure that current injection needed for light emission occurs only in the active region. According to at least one example embodiment, the light confinement structure 225 comprises one or more un-etched areas of the epitaxial structure 210 that are interspersed between etched areas of the epitaxial structure 210. Proportions of the one or more un-etched areas and proportions of the etched areas are selected to balance a desired index-guiding provided by the light confinement structure 225 with scattering losses induced by the light confinement structure 225. The etched areas may bound the un-etched areas to create separate light-confinement regions. In at least one example embodiment, the separate light-confinement regions comprise one or more spoke-shaped structures that extended directly from a center of the active region 230 and function as the feedback cavities to the active region 230 to produce bandwidth enhancement.

At least one example embodiment also provides a VCSEL die including an epitaxial structure 210 and a p-type contact layer 255 positioned in proximity to the epitaxial layer 210. The VCSEL die includes a light confinement structure 225 configured to confine light produced within the epitaxial structure 210 to emit only from a specific area. The p-type contact layer 255, by covering the majority of the light confinement area, works in conjunction with the p-DBR stack to cause the confined light to emit away from the p-type contact layer 255. The light confinement structure 225 provides a low-refraction index boundary that confines light in an active region 230 that is at least partially surrounded by the light confinement structure 225. According to at least one example embodiment, the light confinement structure 225 comprises one or more un-etched areas of the epitaxial structure 210 that are interspersed between etched areas of the epitaxial structure 210. Proportions of the one or more un-etched areas and proportions of the etched areas are selected to balance a desired index-guiding provided by the light confinement structure 225 with scattering losses induced by the light confinement structure 225.

In view of the above, it should be understood that example embodiments provide optical devices that enhance bandwidth of emitted light. Although example embodiments have been described with reference to a p-down VCSEL configuration, it should be appreciated that one or more example embodiments may also be applied to other VCSEL configurations if desired.

According to at least one example embodiment, a light-emitting device includes a substrate having a first surface and an opposing second surface, and an epitaxial structure having a first surface and an opposing second surface. The second surface of the epitaxial structure is positioned in proximity with the first surface of the substrate. The light-emitting device includes a first metal layer having a first surface and an opposing second surface, where the second surface of the first metal layer faces toward the first surface of the substrate. The light-emitting device includes at least one light confinement structure configured to confine light produced within the epitaxial structure, and a metal contact covering most of the light-confinement area to cause the confined light to emit away from the first surface of the substrate. The at least one light confinement structure provides a low-refraction index boundary that confines the light in a mesa structure that is at least partially surrounded by the at least one light confinement structure.

According to at least one example embodiment, the at least one light confinement structure comprises a trench in the epitaxial structure that at least partially surrounds the mesa structure.

According to at least one example embodiment, the trench completely surrounds the mesa structure.

According to at least one example embodiment, the at least one light confinement structure comprises one or more un-etched areas of the epitaxial structure that are interspersed between etched areas of the epitaxial structures.

According to at least one example embodiment, proportions of the one or more un-etched areas and proportions of the etched areas are selected to balance a desired index-guiding provided by the at least one light confinement structure with scattering losses induced by the at least one light confinement structure.

According to at least one example embodiment, the etched areas bound the un-etched areas to create separate light-confinement regions of the at least one light confinement structure.

According to at least one example embodiment, the separate light-confinement regions comprise one or more spoke-shaped structures that extend from a center of the mesa structure.

According to at least one example embodiment, the epitaxial structure comprises a first distributed Bragg reflector (DBR) stack and a quantum well (QW) region.

According to at least one example embodiment, the epitaxial structure further comprises a second DBR stack, and the QW region is sandwiched between the first DBR stack and the second DBR stack.

According to at least one example embodiment, the first DBR stack comprises a p-type doping. The second DBR stack comprises an n-type doping, and the first DBR stack is closer to the substrate than the second DBR stack.

According to at least one example embodiment, the mesa structure further comprises a first contact surrounded by the trench. The substrate comprises a high thermal-conductivity non-native substrate and the first contact is in contact with p-type material.

According to at least one example embodiment, the light-emitting device further includes a passivation layer positioned between the first metal layer and the epitaxial structure.

According to at least one example embodiment, a semiconductor device includes a non-native substrate, and a vertical cavity surface emitting laser (VCSEL) having a first side and a second side that faces toward the non-native substrate. Laser light produced by the VCSEL is emitted through the first side of the VCSEL. The VCSEL includes an epitaxial structure, a first metal layer sandwiched between the non-native substrate and the epitaxial layer, and a light confinement structure configured to confine light produced within the epitaxial structure and a metal contact covering most of the light-confinement area to cause the confined light to emit through the front side of the VCSEL. The light confinement structure provides a low-refraction index boundary that confines light in a mesa structure that is at least partially surrounded by the light confinement structure.

According to at least one example embodiment, the light confinement structure comprises a trench that at least partially surrounds the mesa structure.

According to at least one example embodiment, the light confinement structure comprises one or more un-etched areas of the light confinement structure that are interspersed between etched areas of the light confinement structure. Proportions of the one or more un-etched areas and proportions of the etched areas are selected to balance a desired index-guiding provided by the light confinement structure with scattering losses induced by the light confinement structure.

According to at least one example embodiment, the etched areas bound the un-etched areas to create separate light-confinement regions.

According to at least one example embodiment, the separate light-confinement regions comprise one or more spoke-shaped structures that extended directly from a center of the mesa structure.

According to at least one example embodiment, the epitaxial structure comprises a first distributed Bragg reflector (DBR) stack, a second DBR stack, and a quantum well (QW) region sandwiched between the first DBR stack and the second DBR stack. The first DBR stack is positioned closer to the non-native substrate than the second DBR stack, and the first DBR stack comprises a p-type doping.

According to at least one example embodiment, a Vertical Cavity Surface Emitting Laser (VCSEL) die includes an epitaxial structure, a contact layer positioned in proximity to the epitaxial structure, and a light confinement structure configured to confine light produced within the epitaxial structure and, in conjunction with the contact layer, to cause the confined light to emit away from the contact layer. The light confinement structure provides a low-refraction index boundary that confines light in a mesa structure that is at least partially surrounded by the light confinement structure.

According to at least one example embodiment, the light confinement structure comprises one or more un-etched areas of the epitaxial layer that are interspersed between etched areas of the epitaxial layer. Proportions of the one or more un-etched areas and proportions of the etched areas are selected to balance a desired index-guiding provided by the light confinement structure with scattering losses induced by the light confinement structure.

In addition, it should be understood that specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring example embodiments.

While illustrative embodiments have been described in detail herein, it is to be understood that inventive concepts may be otherwise variously embodied and employed, and that the appended claims are intended to be construed to include such variations, except as limited by the prior art.

What is claimed is:
1. A light-emitting device, comprising:
a substrate having a first surface and an opposing second surface;
an epitaxial structure having a first surface and an opposing second surface, the second surface of the epitaxial structure being positioned in proximity with the first surface of the substrate;
a first metal layer having a first surface and an opposing second surface, the second surface of the first metal layer facing toward the first surface of the substrate; and
at least one light confinement structure configured to confine light produced within the epitaxial structure, wherein the at least one light confinement structure provides a low-refraction index boundary that confines the light in a mesa structure that is at least partially surrounded by the at least one light confinement structure;
wherein the at least one light confinement structure includes a trench in the second surface of the epitaxial structure that at least partially surrounds the mesa structure, and wherein the first metal layer is in the trench and extends along an entire width of the mesa structure in a cross sectional view.

2. The light-emitting device of claim 1, further comprising:
a second metal layer on the first surface of the epitaxial structure, the second metal layer including an opening that allows emission of the light.

3. The light-emitting device of claim 2, further comprising:
a passivation layer between the first metal layer and the epitaxial structure, wherein the passivation layer includes a portion in the trench, and wherein the trench completely surrounds the mesa structure.

4. The light-emitting device of claim 1, wherein the at least one light confinement structure comprises one or more un-etched areas of the epitaxial structure that are interspersed between etched areas of the epitaxial structures.

5. The light-emitting device of claim 4, wherein proportions of the one or more un-etched areas and proportions of the etched areas are selected to balance a desired index-guiding provided by the at least one light confinement structure with scattering losses induced by the at least one light confinement structure.

6. The light-emitting device of claim 5, wherein the etched areas bound the un-etched areas to create separate light-confinement regions of the at least one light confinement structure.

7. The light-emitting device of claim 6, wherein the separate light-confinement regions comprise one or more spoke-shaped structures that extend from a center of the mesa structure.

8. The light-emitting device of claim 2, wherein the epitaxial structure comprises a first distributed Bragg reflector (DBR) stack and a quantum well (QW) region.

9. The light-emitting device of claim 8, wherein the epitaxial structure further comprises a second DBR stack and wherein the QW region is sandwiched between the first DBR stack and the second DBR stack.

10. The light-emitting device of claim 9, wherein the first DBR stack comprises a p-type doping, wherein the second DBR stack comprises an n-type doping, and wherein the first DBR stack is closer to the substrate than the second DBR stack.

11. The light-emitting device of claim 10, wherein the mesa structure further comprises:
a first contact surrounded by the trench, wherein the substrate comprises a high thermal-conductivity non-native substrate, and wherein the first contact is reflective and in contact with a p-type material.

12. The light-emitting device of claim 11, further comprising a passivation layer positioned between the first metal layer and the epitaxial structure.

13. A semiconductor device, comprising:
a non-native substrate; and
a vertical cavity surface emitting laser (VCSEL) having a first side and a second side that faces toward the non-native substrate, wherein laser light produced by the VCSEL is emitted through the first side of the VCSEL, wherein the VCSEL comprises:
an epitaxial structure;
a first metal layer sandwiched between the non-native substrate and the epitaxial layer; and
a light confinement structure configured to confine light produced within the epitaxial structure, wherein the light confinement structure provides a low-refraction index boundary that confines light in a mesa structure that is at least partially surrounded by the light confinement structure;
wherein the light confinement structure includes a trench in the epitaxial structure that at least partially surrounds the mesa structure, and
wherein the first metal layer is in the trench and extends along an entire width of the mesa structure in a cross sectional view.

14. The semiconductor device of claim 13, wherein the trench completely surrounds the mesa structure.

15. The semiconductor device of claim 13, wherein the light confinement structure comprises one or more un-etched areas of the light confinement structure that are interspersed between etched areas of the light confinement structure, wherein proportions of the one or more un-etched areas and proportions of the etched areas are selected to balance a desired index-guiding provided by the light confinement structure with scattering losses induced by the light confinement structure.

16. The semiconductor device of claim 15, wherein the etched areas bound the un-etched areas to create separate light-confinement regions.

17. The semiconductor device of claim 16, wherein the separate light-confinement regions comprise one or more spoke-shaped structures that extended directly from a center of the mesa structure.

18. The semiconductor device of claim 13, wherein the epitaxial structure comprises a first distributed Bragg reflector (DBR) stack, a second DBR stack, and a quantum well (QW) region sandwiched between the first DBR stack and the second DBR stack, wherein the first DBR stack is positioned closer to the non-native substrate than the second DBR stack, and wherein the first DBR stack comprises a p-type doping.

19. A Vertical Cavity Surface Emitting Laser (VCSEL) die, comprising:
an epitaxial structure;
a contact layer positioned in proximity to the epitaxial structure; and
a light confinement structure configured to confine light produced within the epitaxial structure and, in conjunction with the contact layer, to cause the confined light to emit away from the contact layer, wherein the light confinement structure provides a low-refraction index boundary that confines light in a mesa structure that is at least partially surrounded by the light confinement structure;
wherein the light confinement structure includes a trench in the epitaxial structure that at least partially surrounds the mesa structure, and
wherein the first metal layer is in the trench and extends along an entire width of the mesa structure in a cross sectional view.

20. The VCSEL die of claim 19, wherein the light confinement structure comprises one or more un-etched areas of the epitaxial layer that are interspersed between etched areas of the epitaxial layer, and wherein proportions of the one or more un-etched areas and proportions of the etched areas are selected to balance a desired index-guiding provided by the light confinement structure with scattering losses induced by the light confinement structure.

* * * * *